US006964877B2

(12) United States Patent
Chen et al.

(10) Patent No.: US 6,964,877 B2
(45) Date of Patent: Nov. 15, 2005

(54) LED POWER PACKAGE

(75) Inventors: Chen-Lun Hsing Chen, North Olmsted, OH (US); Stanton Weaver, Jr., Northville, NY (US); Ivan Eliashevich, Maplewood, NJ (US); Sebastien Libon, New York, NY (US); Mehmet Arik, Niskayuna, NY (US); David Shaddock, Troy, NY (US)

(73) Assignee: GELcore, LLC, Valley View, OH (US)

( * ) Notice: Subject to any disclaimer, the term of this patent is extended or adjusted under 35 U.S.C. 154(b) by 0 days.

(21) Appl. No.: 10/832,969

(22) Filed: Apr. 27, 2004

(65) Prior Publication Data

US 2004/0203189 A1 Oct. 14, 2004

Related U.S. Application Data

(62) Division of application No. 10/402,505, filed on Mar. 28, 2003.

(51) Int. Cl.[7] ................................................ H01L 21/00
(52) U.S. Cl. ......................................... 438/20; 438/106
(58) Field of Search .............................. 438/20, 22, 24, 438/46, 47, 48, 51, 55, 64, 93, 94, 106, 107, 108, 109, 110, 112

(56) References Cited

U.S. PATENT DOCUMENTS

| | | | |
|---|---|---|---|
| 5,071,787 A | * 12/1991 | Mori et al. .................... 29/840 |
| 5,113,315 A | 5/1992 | Capp. et al. .................. 361/386 |
| 5,719,440 A | 2/1998 | Moden | |
| 5,886,401 A | 3/1999 | Liu ............................. 257/678 |
| 5,942,770 A | 8/1999 | Ishinaga et al. | |
| 6,187,611 B1 | 2/2001 | Preston et al. | |
| 6,201,304 B1 | 3/2001 | Moden | |
| 6,236,112 B1 | 5/2001 | Horiuchi et al. | |
| 6,265,766 B1 | 7/2001 | Moden | |
| 6,407,438 B1 | 6/2002 | Severn | |
| 6,531,328 B1 | 3/2003 | Chen .......................... 438/106 |
| 6,614,172 B2 * | 9/2003 | Chiu et al. ................... 313/501 |
| 6,787,435 B2 * | 9/2004 | Gibb et al. ................... 438/507 |
| 2003/0042507 A1 | 3/2003 | Slater, Jr. et al. | |
| 2003/0045015 A1 | 3/2003 | Slater, Jr. et al. | |

FOREIGN PATENT DOCUMENTS

| | | |
|---|---|---|
| JP | 63-107186 | 5/1988 |
| JP | 07263754 | 10/1995 |
| WO | WO 01/47036 | 12/2000 |
| WO | WO 02/089221 | 11/2002 |

* cited by examiner

*Primary Examiner*—David Nhu
(74) *Attorney, Agent, or Firm*—Fay, Sharpe, Fagan, Minnich & McKee, LLP

(57) ABSTRACT

Surface mount light emitting diode (LED) packages each contain a light emitting diode (LED) die (24). A plurality of arrays of openings are drilled into an electrically insulating sub-mount wafer (10). A metal is applied to the drilled openings to produce a plurality of via arrays (12). The LED dice (24) are flip-chip bonded onto a frontside (16) of the sub-mount wafer (10). The p-type and n-type contacts of each flip-chip bonded LED (24) electrically communicate with a solderable backside (18) of the sub-mount wafer (10) through a via array (12). A thermal conduction path (10, 12) is provided for thermally conducting heat from the flip-chip bonded LED dice (24) to the solderable backside (18) of the sub-mount wafer (10). Subsequent to the flip-chip bonding, the sub-mount wafer (10) is separated to produce the surface mount LED packages.

13 Claims, 15 Drawing Sheets

LED POWER PACKAGE

This application in a divisional of Ser. No. 10/402,505 filed on Mar. 28, 2003.

BACKGROUND OF THE INVENTION

The present invention relates to the lighting arts. It is particularly applicable to the fabrication of high-brightness gallium nitride (GaN) based light emitting diodes (LEDs) and LED arrays, and will be described with particular reference thereto. However, the invention also finds application in connection with other types of LEDs and in other LED applications.

LEDs, particularly those fabricated from gallium nitride (GaN), aluminum nitride (AlN), indium nitride (InN), and various alloys and layer combinations thereof, are suitable for illumination applications in the ultraviolet and blue wavelength ranges. Additionally, GaN-based LEDs which are coated with a wavelength-converting phosphor are suitable for producing white or selectably colored light for illumination. Such LEDs have a number of advantages over other types of illuminators, including compactness, low operating voltages, and high reliability.

However, GaN-based power LEDs for lighting applications suffer from low luminous output. A state-of-the-art GaN-based LED presently dissipates about 5 watts while generating about 100 lumens. In contrast, a typical incandescent light source dissipates about 60 watts while generating about 1,000 lumens of light output. Heat dissipation is a limiting factor in the luminous output and reliability of power LEDs. Although heat sinks provide for heat removal in LED-based lighting systems, there remains a need for improved heat removal from the active region of the LED die to the heat sink.

In a conventional GaN-based LED package, the active GaN layers are arranged on a sapphire or other transparent substrate in a flip-chip orientation in which the active GaN layers are bonded to a silicon or other thermally conductive sub-mount which in turn is supported on a lead frame or a printed circuit board. The silicon sub-mount is insulating and includes bonding pads that connect with electrodes of the LED die during the flip-chip bonding. The bonding pads of the silicon sub-mount are electrically connected with the lead frame or traces of the printed circuit board by wire-bonding. Light emitted by the GaN layers is transmitted through the transparent LED substrate, while heat produced by the GaN layers is conducted through the silicon sub-mount to a heat sink integrated into or associated with the lead frame or printed circuit board.

The conventional GaN-based LED package suffers from a number of disadvantages. Packaging is complex due to the separate steps of bonding the GaN layers to the sub-mount, bonding the sub-mount to the associated support, and wire-bonding the bonding pads to the lead frame. The package is incompatible with wafer-level processing typically employed in other areas of the electronics industry, which impacts production throughput and yield. Although some wafer level processing can be performed on the epitaxial GaN wafer prior to dicing, certain processes such as die encapsulation cannot be performed prior to dicing. Thermal conductivity, while improved by using the silicon sub-mount, is still non-ideal. The overall package is bulky.

The present invention contemplates an improved apparatus and method for forming the same that overcomes the above-mentioned limitations and others.

BRIEF SUMMARY

In accordance with one aspect, a method is provided for producing a plurality of surface mount light emitting diode (LED) packages. A plurality of light emitting diode (LED) dice are fabricated. Each LED die includes light emitting semiconductor layers disposed on a light-transmissive substrate, and frontside p-type and n-type contacts disposed on the semiconductor layers opposite the light-transmissive substrate. A plurality of arrays of openings are drilled into an electrically insulating sub-mount wafer. A metal is applied to the drilled openings to produce a plurality of via arrays. The LED dice are flip-chip bonded onto a frontside of the sub-mount wafer. The p-type and n-type contacts of each flip-chip bonded LED electrically communicate with a solderable backside of the sub-mount wafer through a via array. A thermal conduction path is provided for thermally conducting heat from the flip-chip bonded LED dice to the solderable backside of the sub-mount wafer. Subsequent to the flip-chip bonding, the sub-mount wafer is separated to produce surface mount LED packages each including at least one LED die.

In accordance with another aspect, a light emitting diode (LED) package is disclosed. An LED has a first side on which a pair of electrical contacts are arranged and a second side. A submount has a first side onto which the first side of the LED is bonded and a second side. Said submount provides: a plurality of electrically conductive paths that extend from the second side of the submount to the first side of the submount, said electrically conductive paths connecting with the electrical contacts of the LED such that electrical power is deliverable to the LED from the second side of the submount; and one or more thermally conductive paths that extend from the first side of the submount to the second side of the submount such that heat generated by the LED is removable therefrom from the second side of the submount.

In accordance with yet another aspect, a light emitting diode (LED) package is disclosed. An LED includes electrical contacts arranged on a surface thereof. An electrically insulating sub-mount has: (i) a frontside including printed circuitry contacting the LED electrical contacts; (ii) a backside including electrical contact pads; and (iii) electrically conductive paths passing through the insulating sub-mount and connecting the printed circuitry of the front-side with the electrical contact pads of the back-side to deliver electrical power from to the back-side sub-mount contact pads to the LED.

In accordance with still yet another aspect, a method for constructing a plurality of light emitting diode (LED) packages is provided. A plurality of LEDs are flip-chip bonded to a frontside of an electrically insulating sub-mount wafer. The sub-mount wafer includes front-side contacts that electrically contact electrodes of the LED during the flip-chip bonding, and electrically conductive paths that electrically connect the front-side contacts with solderable contact pads arranged on a backside of the sub-mount wafer. At least one wafer-level processing operation is performed on the sub-mount wafer with the LEDs flip-chip bonded thereto. The sub-mount wafer is separated to produce the plurality of LED packages. Each LED package contains at least one of the plurality of LEDs.

Numerous advantages and benefits of the present invention will become apparent to those of ordinary skill in the art upon reading and understanding the following detailed description.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention. Further, it is to be appreciated that the LED drawings are not to scale.

DETAILED DESCRIPTION OF THE PREFERRED EMBODIMENTS

Figure 1A:
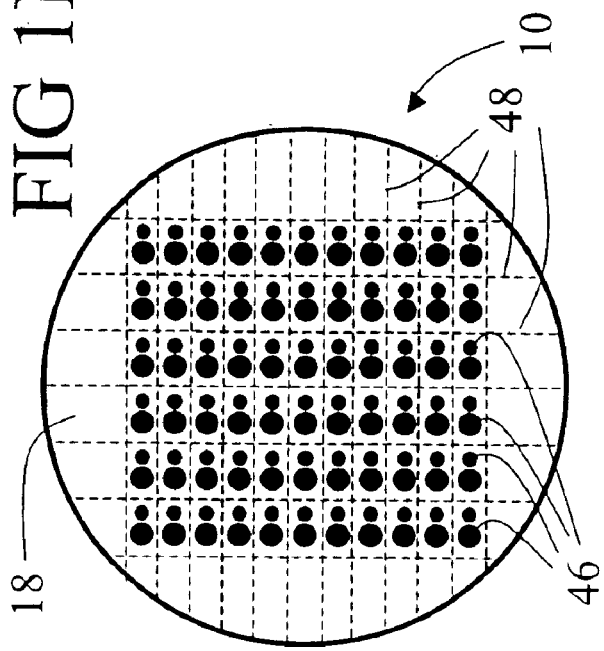
FIG. 1A shows a frontside view of a sub-mount wafer including a plurality of arrays of electrical vias, and dashed lines indicating separation planes for separating individual LED packages.
Figure 1B:
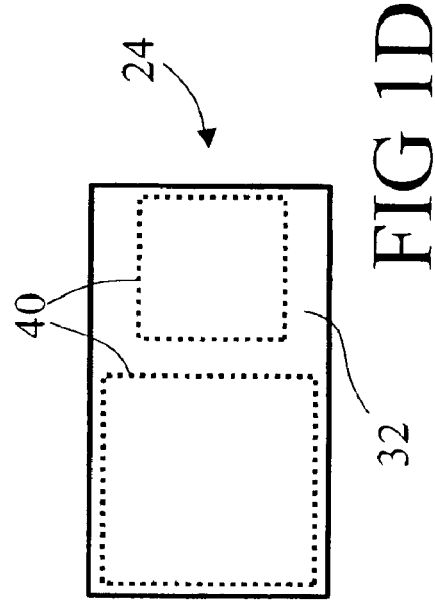
FIG. 1B shows a backside view of the sub-mount wafer of FIG. 1A including solderable contact pads and dashed lines indicating separation planes for separating individual LED packages.
Figure 1C:
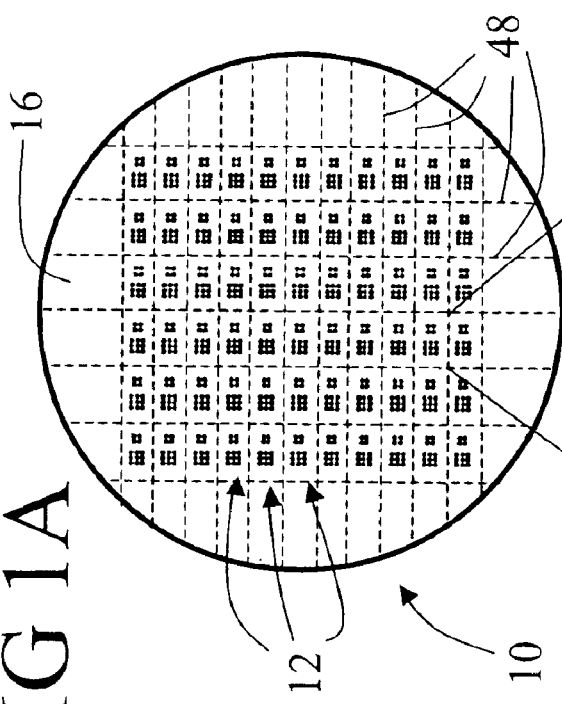
FIG. 1C shows a frontside view of one of array of electrical vias with dashed lines indicating separation planes for separating the LED package.
Figure 1D:
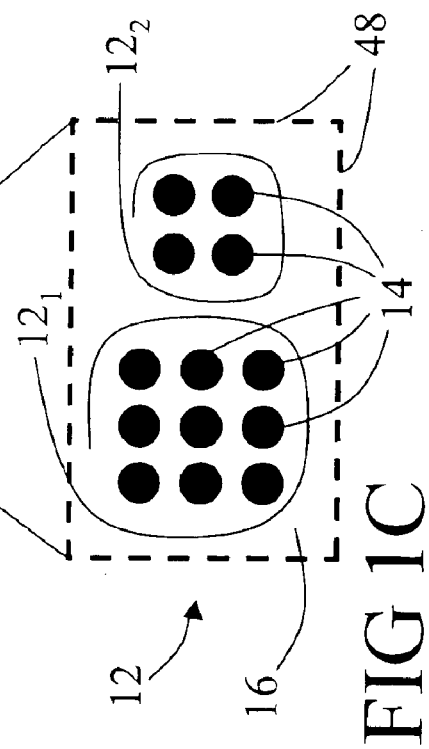
FIG. 1D shows a backside view (looking through the transparent substrate) of an LED die that flip-chip bonds to the vias array of FIG. 1C. Electrodes on the frontside of the LED die are shown in phantom.
Figure 1E:
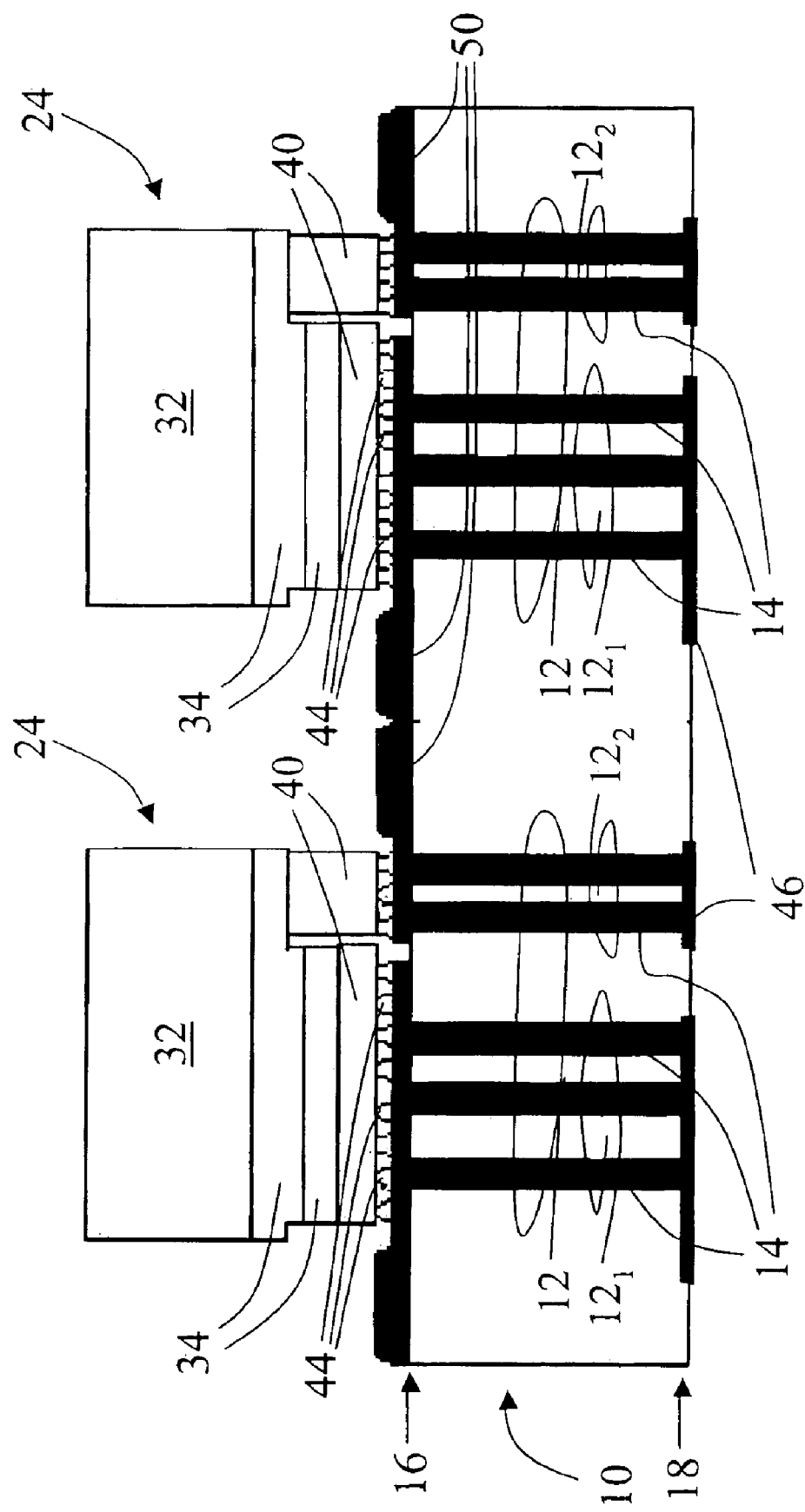
FIG. 1E shows a side sectional view of two LED dice of the type shown in FIG. 1D flip-chip bonded to two via arrays of the type shown in FIG. 1C.

With reference to FIGS. 1A–1E, a plurality of surface mount light emitting diode (LED) packages are produced using a common sub-mount wafer 10 that includes arrays 12 of electrically conductive vias 14 that pass from a frontside 16 of the sub-mount wafer 10 to a backside 18 of the sub-mount wafer 10.

LED dice 24 each include a light transmissive substrate 32 on which p-type and n-type semiconductor layers 34 are deposited to form a light emitting p/n diode structure that emits light when electrically energized. Metallic, polymeric, or another type of p-type and n-type electrodes 40 of are formed on the semiconductor layers 34 for electrically energizing the LED die 24. In one preferred embodiment, the LED dice 24 are GaN-based LEDs in which the semiconductor layers 34 are a multiple layer stack of AlN, GaN, InN, or alloys thereof which are deposited on a light-transmissive sapphire or SiC substrate. Although two semiconductor layers 34 are shown, it should be appreciated that a more complex semiconductor multi-layer stack of either an n-on-p or a p-on-n configuration can be employed. For example, the multi-layer stack can include AlN or AlGaN epitaxial buffers, optical claddings, InN or InGaN quantum wells, or the like. Moreover, the semiconductor layers 34 can be other than nitride layers and the substrate 34 can be made of other materials, such as an LED die including phosphide-based semiconductor layers on a wide bandgap, light transmissive semiconductor substrate.

The LED dice 24 are flip-chip bonded to the frontside 16 of the sub-mount wafer 10 to electrically contact the vias arrays 12. Specifically, the electrodes 40 of each LED die 24 are thermosonically bonded to bonding bumps 44 disposed on frontside ends of the conductive vias 14 or on printed circuitry 50 that electrically communicates with the vias 14. Backside ends of the conductive vias 14 electrically communicate with solderable contact pads 46 which are suitable for soldering the LED package to a printed circuit board or other support as a surface mount LED package. Electrical power applied to the contact pads 46 is conducted by the vias 14 and the bonding bumps 44 to the electrodes 40 of the LED dice 24.

After the LED dice 24 are flip chip bonded, the sub-mount wafer 10 is preferably separated along separation planes 48 (shown as dashed lines in FIGS. 1A, 1B, and 1C) to produce separated surface mount LED packages each including a flip-chip bonded LED die 24 and a vias array 12.

Optionally, more than one LED die 24 is included in each separated LED package. For example, FIG. 1E two LED dice 24 are included in a single package. In this case, electrical connecting printed circuitry 50 can be deposited on the frontside 16 of the sub-mount wafer 10. (Note, the printed circuitry 50 is omitted in FIGS. 1A and 1C). Alternatively, the printed circuitry 50 can be omitted and the backside contact pads 46 of each vias array 12 of the multiple LED die package are separately electrically contacted to energize the plurality of LED dice.

Figure 2:
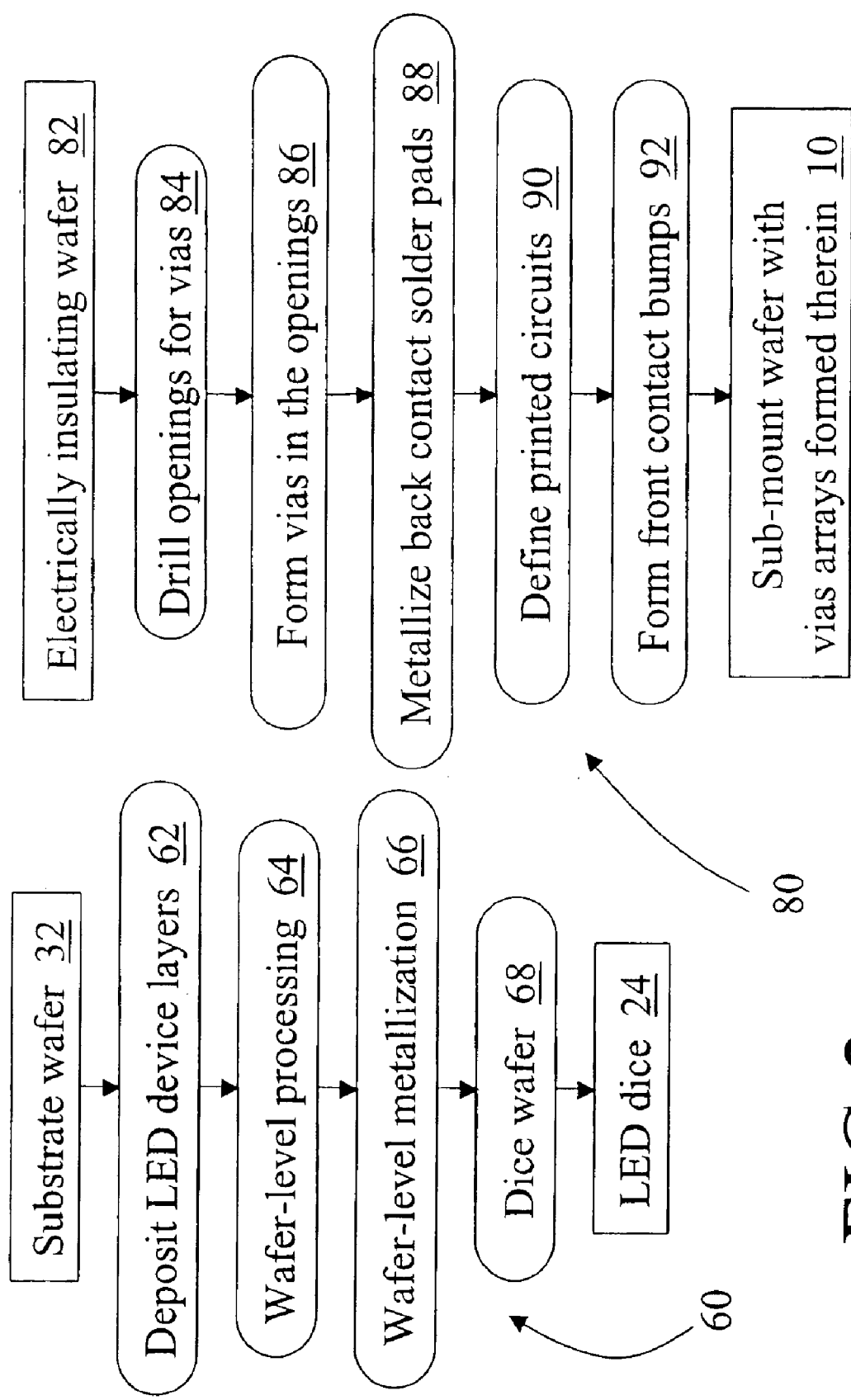
FIG. 2 shows a suitable processing flow diagram for manufacturing LED dice and a sub-mount wafer with vias arrays formed therein.

With continuing reference to FIGS. 1A–1E and with further reference to FIG. 2, a suitable method 60 for fabricating the LED dice 24 includes depositing 62 the LED device semiconductor layers on the light transmissive substrate wafer 32. For GaN-based LED dice fabrication, the depositing 62 is suitably performed by metal-organic chemical vapor deposition (MOCVD), molecular beam epitaxy (MBE), or another epitaxial deposition technique. Wafer level processing 64 by photolithography, wet chemical etching, plasma etching, and the like is performed to define device mesas, expose buried semiconductor layers, and so forth. Wafer-level metallization 66 performed in conjunction with lithographic definition of metallization areas is used to form the electrodes 40. In one preferred embodiment, the electrodes 40 are principally gold, optionally disposed on a titanium adhesion layer and/or a nickel diffusion barrier layer. The wafer is diced 68 to separate the individual LED die 24.

With continuing reference to FIGS. 1A–2, a suitable method 80 for fabricating the sub-mount wafer 10 including the vias arrays 12 starts with a suitable electrically insulating wafer 82. Electrically insulating sub-mount materials can be chosen from ceramics such as alumina, BeO, AlN, and the like, or composites such as AlSiC, graphite-filled polymers, or the like. Openings for the vias 14 are drilled 84 mechanically, by laser drilling, by photolithographic wet chemical etching, or the like. The vias are formed 86 by filling the openings with an electrically conductive material, preferably copper. The filling can be done using masked electroplating or other high-speed deposition, or by using a programmed step-and-repeat injection nozzle. Suitable via materials include metals such as silver, copper, gold, aluminum, platinum, palladium, tungsten, alloys thereof, or the like. Optionally, rather than filling the openings, the via material can be electroplated or otherwise deposited on sidewalls of the openings.

In metallization processing 88, 90, the solderable back contact pads 46 and optional frontside printed circuitry 50 is photolithographically defined and applied. Since the wafer 82 is electrically insulating, these metallizations can be deposited directly to onto the wafer 82. Optionally, a silicon nitride or other insulating layer is first deposited on the wafer 82 to provide further electrical isolation.

The bonding bumps 44 are formed 92 on the frontside ends of the electrically conductive vias 14 or on the printed circuitry 50. In one embodiment, solder bumps are employed. However, typical solders for flip chip bonding have thermal conductivities of about 25–60 W/mK and bump heights greater than 1 mil (25 microns). The large height and relatively low thermal conductivity limits thermal heat sinking via the solder bonding bumps.

Hence, in a preferred embodiment, the bonding bumps 44 are made principally of copper, and thermosonic flip chip bonding is used. Typical copper thermal conductivities are about 400 W/mK, and copper bump heights of less than 0.5 mils (13 microns) are obtainable. The increased thermal conductivity and lower bump height compared with solder bumps reduces thermal impedance. However, there is typically a tradeoff in that larger bonding bump heights promote reliability, while lower bonding bump heights reduce thermal resistance of the bumps. In one preferred embodiment, about 1 mil (25 microns) copper bumps are used. In the illustrated embodiment, the bonding bumps 44 are formed on the printed circuitry 50. Alternatively, however, bonding bumps for thermosonic bonding can be formed on the light emitting diodes.

In one suitable approach for forming the bonding bumps 44, the frontside ends of the vias 14 or the printed circuitry 50 on which the bonding bumps are to be formed are terminated in a thin titanium layer. To prepare the surface, this terminating titanium layer is partially or completely etched away just prior to bumps formation 92. A thin seed layer such as 20 nm titanium/150 nm copper is deposited, and the copper bumps positions are photolithographically defined. The copper bumps are electroplated onto the exposed areas of the seed layer. The photolithographic mask is removed, and the thin seed layer etched off.

The copper bumps are preferably lithographically coated with gold to promote the thermosonic bonding. Optionally, a titanium layer is deposited onto the copper bumps before applying the gold coating to promote gold adhesion. A thermosonic gold-to-gold bond between the bonding bumps 44 and the electrodes 40 is formed by heating the substrate 10 to about 150° C. with the bonding bumps 44 contacting corresponding gold surfaces of the electrodes 40 of the light emitting diodes 24. Upon application of ultrasonic energy, the thermosonic bond forms. Advantageously, this thermosonic bond forms at about 150° C., but provides a die-attachment that is thereafter thermally stable up to about 600° C.

The vias arrays 12 of the sub-mount 10 of FIGS. 1A–1E each include a first vias sub-array $12_1$ of electrically conductive vias 14 that contact the first (p-type or n-type) electrode 40, and a second via sub-array $12_2$ of electrically conductive vias 14 that contact the second (n-type or p-type) electrode 40. Heat sinking occurs through the electrically conductive vias 14 of the sub-arrays $12_1$, $12_2$. The vias 14 are spatially distributed within each sub-array $12_1$, $12_2$ to provide generally uniform heat sinking of the attached LED die 24. Alternative or additional heat sinking can be provided by the sub-mount 10, if the sub-mount 10 is formed of a thermally conductive material. For example, AlN provides substantial thermal conduction for heat sinking.

Figure 3:
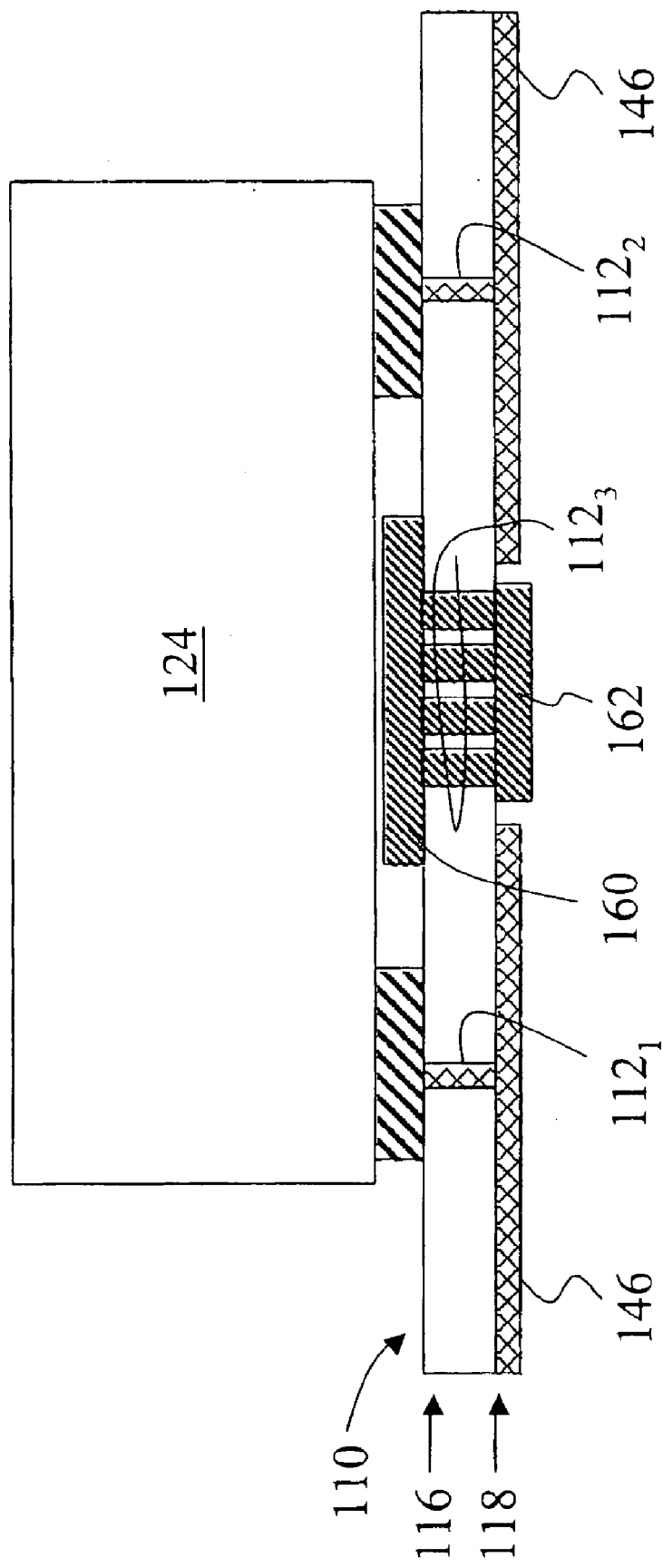
FIG. 3 shows a side sectional view of an LED package that includes a third sub-array of vias which are designated thermally conductive vias.

With reference to FIG. 3, an LED package with an designated heat sinking vias through the sub-mount is described. In the LED package of FIG. 3, components that correspond to substantially similar components of the LED package of FIGS. 1A–1E are indicated with reference numbers offset by a factor of 100, e.g. an LED die 124 in FIG. 3 corresponds with the LED die 24 of FIGS. 1A–1E. A sub-mount 110 includes a frontside 116 and a backside 118, and solderable contact pads 146. The LED package of FIG. 3 has smaller electrical contacting regions connecting with the vias sub-arrays $112_1$, $112_2$ which provide limited heat sinking. The sub-mount 110 in combination with the vias sub-arrays $112_1$, $112_2$ is not thermally conductive enough to provide adequate and substantially uniform heat sinking for the LED die 124.

To provide additional heat sinking, a third vias sub-array $112_3$ of designated heat sinking vias is provided. The vias of the third vias sub-array $112_3$ do not electrically contact the LED die 124, and do not contribute to electrical energizing of the LED die 124. The vias of the third vias sub-array $112_3$ are thermally conductive, but can be electrically conductive or electrically insulating. The vias sub-array $112_3$ is suitably formed similarly to the process operations 84, 86 that form the electrical vias. Frontside ends of the thermal vias sub-array $112_3$ thermally communicate with a thermally conductive underfill material 160 disposed between the LED die 124 and the sub-mount 110 to provide thermal contact between the LED die 124 and the designated thermal vias sub-array $112_3$. A thermally conductive pad 162 contacting backside ends of the thermal vias sub-array $112_3$ provides thermal contact with the printed circuit board or other support on which the surface mount LED package is arranged.

Figure 4:
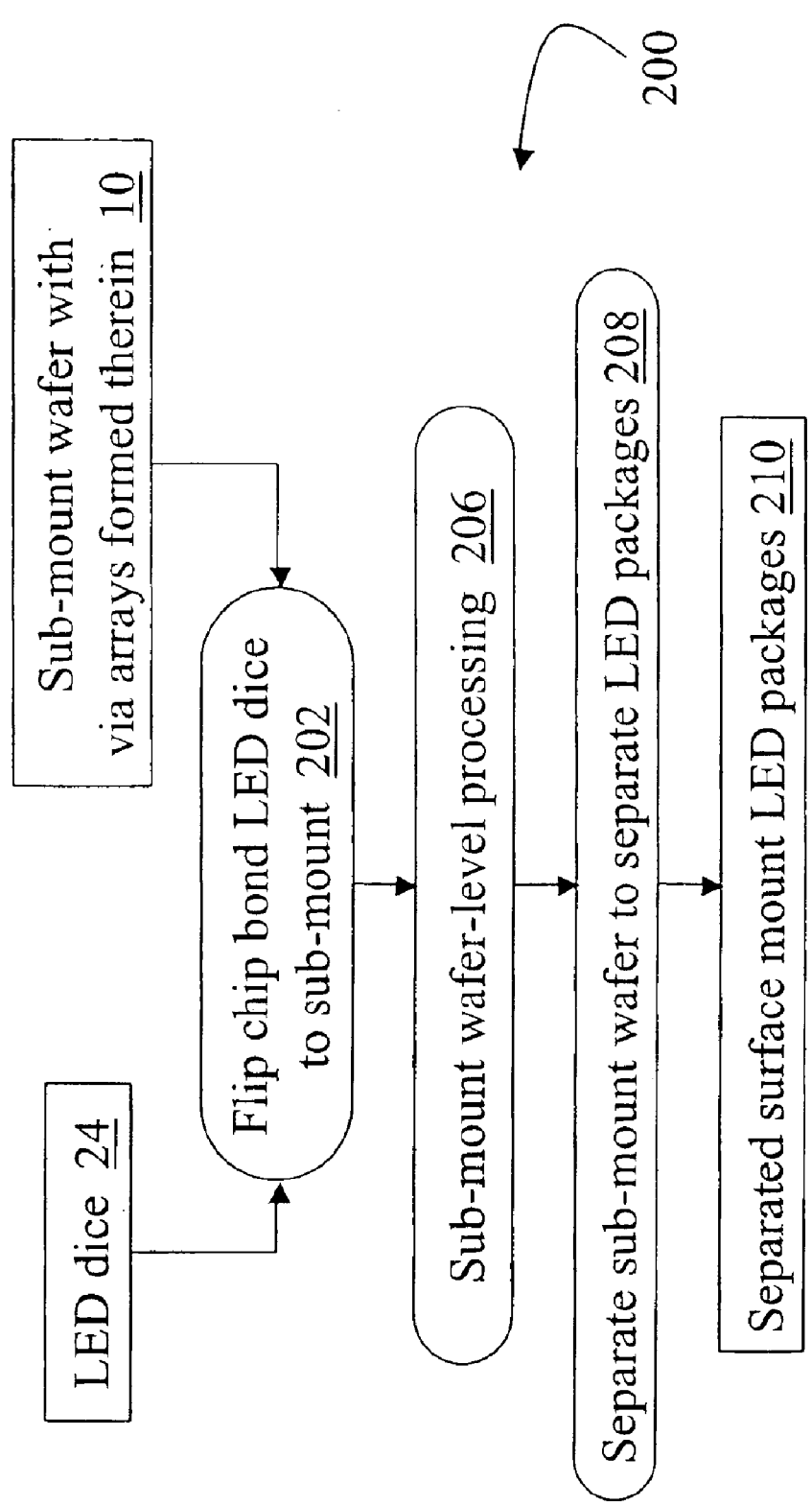
FIG. 4 shows a suitable method for combining the LED dice and sub-mount wafer components fabricated in accordance with the processing of FIG. 2 to produce separated LED packages.

With continuing reference to FIGS. 1A–2 and with further reference to FIG. 4, a suitable method 200 for combining the LED dice 24 formed by the exemplary process 60 with the sub-mount wafer 10 formed by the exemplary process 80 is described. The LED dice 24 are flip chip bonded 202 to the sub-mount 10. In the preferred embodiment that employs copper bonding bumps 44, thermosonic bonding is preferably employed. Thermosonic bonding advantageously effects bonding at low wafer temperatures of about 150° C., and the thermosonic bond is thereafter thermally stable up to about 600° C. Alternatively, standard soldering methods can be used.

With the LED dice 24 attached to the sub-mount 10, sub-mount wafer level dice processing 206, such as application of optical coatings, backside substrate processing, step-and-repeat application of LED dice encapsulants, or the like, is optionally performed. Sub-mount wafer level processing beneficially processes all the dice 24 simultaneously or in a convenient step-and-repeat arrangement. Moreover, the sub-mount wafer can be sized to be received and processed by conventional automated silicon processing systems that may not be able to receive and manipulate the undiced LED substrate wafer 32. Furthermore, certain processes, such as LED die encapsulation, cannot be performed prior to die attachment. After the optional sub-mount wafer level processing 206, the sub-mount wafer is sawed, diced, or otherwise cut along the separation planes 48 to produce separated surface mount LED packages 210. The separation can employ mechanical sawing, laser sawing, cleaving, or other suitable techniques.

Figure 5:
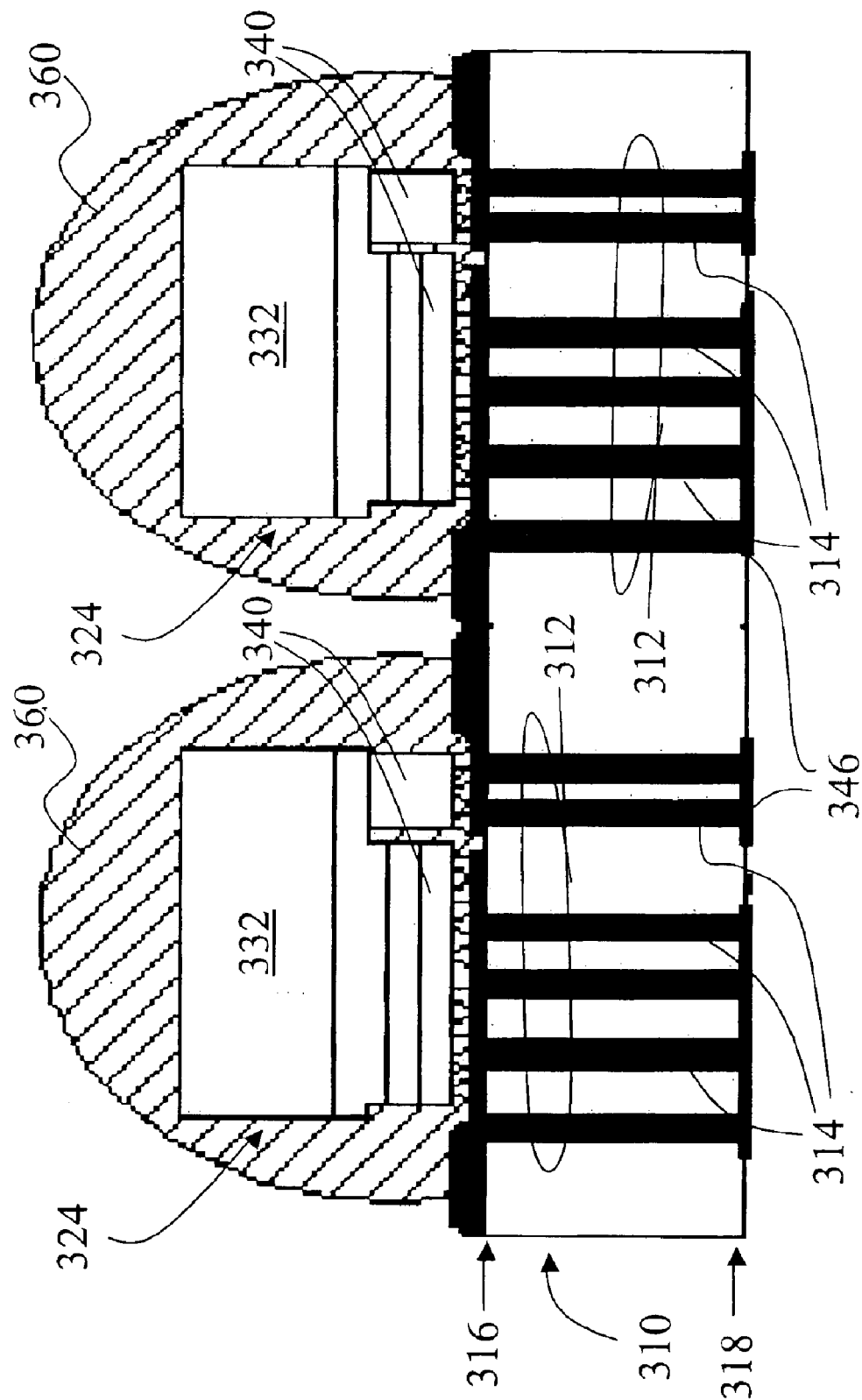
FIG. 5 shows a side sectional view of two LED dice flip-chip bonded to two via arrays with molded material applied to each LED die in a step-and-repeat fashion.

With continuing reference to FIG. 4 and with further reference to FIG. 5, an LED package including individual LED encapsulants 360 applied by sub-mount wafer level processing 206 is described. In the LED package of FIG. 5, components that correspond to substantially similar components of the LED package of FIGS. 1A–1E are indicated with reference numbers offset by a factor of 300, e.g. an LED die 324 in FIG. 5 corresponds with the LED die 24 of FIGS. 1A–1E. A sub-mount wafer 310 includes arrays 312 of electrically conductive vias 314 that pass from a frontside 316 of the sub-mount wafer 310 to a backside 318 of the sub-mount wafer 310, p-type and n-type electrodes 340, and solderable contact pads 346. In fabricating the LED package of FIG. 5, during the sub-mount wafer level processing 206 individual LED encapsulants 360 are applied to each LED die 324 and to a surrounding portion of the front surface 316 of the sub-mount 310 to hermetically seal the LED dice 324. The individual encapsulants 360 are suitably applied using a step-and-repeat apparatus such as are employed in automated silicon device processing. The molded encapsulants 360 are preferably made of an epoxy or other encapsulant material that provides good refractive index matching with the LED substrate 332, and is preferably also shaped to produce a selected lensing of the illumination output.

Figure 6:
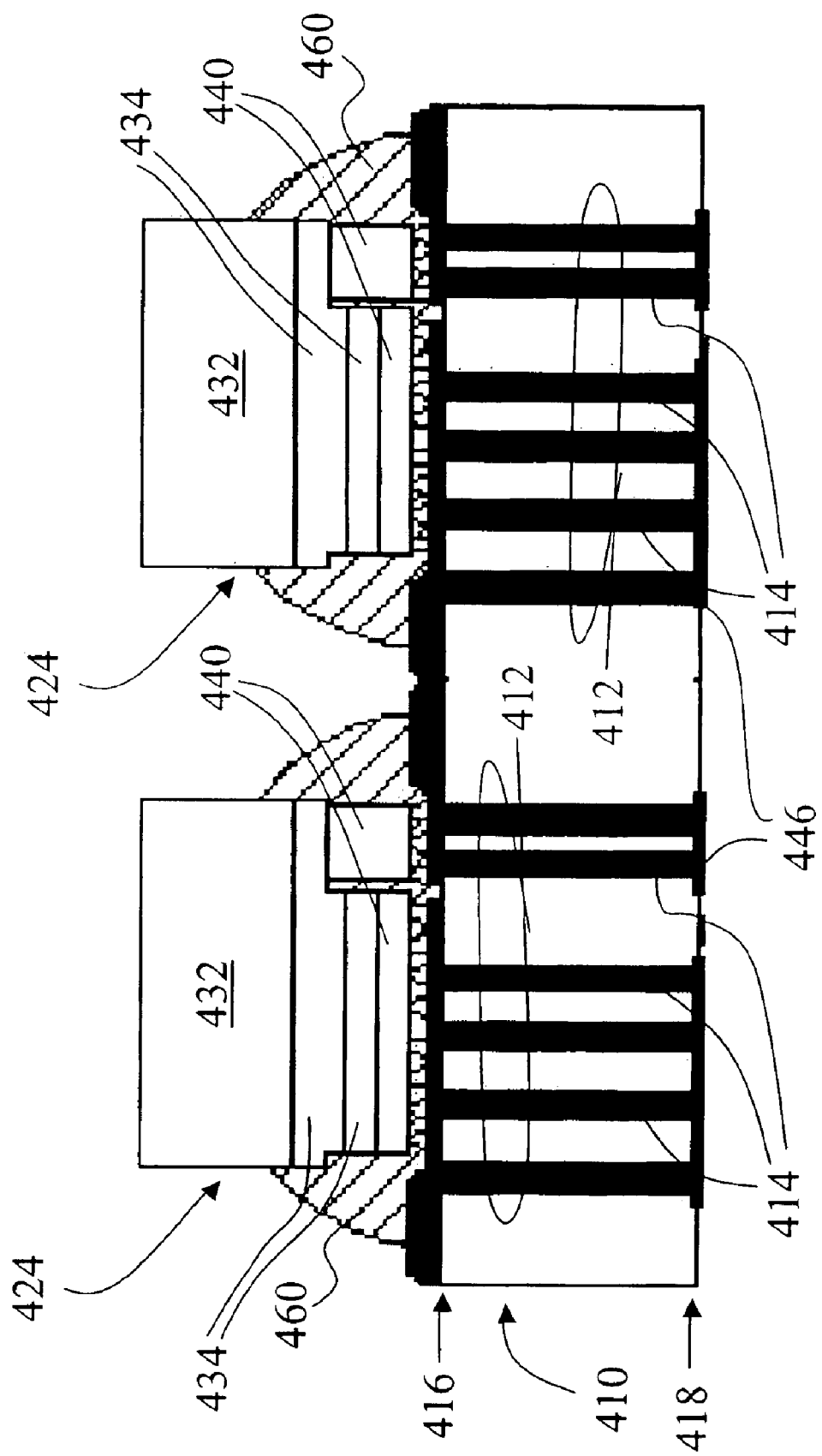
FIG. 6 shows a side sectional view of two LED dice flip-chip bonded to two via arrays with underfill material applied to each LED die in a step-and-repeat fashion.

With continuing reference to FIG. 4 and with further reference to FIG. 6, an LED package including individual LED underfill material 460 applied by sub-mount wafer level processing 206 is described. In the LED package of FIG. 6, components that correspond to substantially similar components of the LED package of FIGS. 1A–1E are indicated with reference numbers offset by a factor of 400, e.g. an LED die 424 in FIG. 6 corresponds with the LED die 24 of FIGS. 1A–1E. A sub-mount 410 includes arrays 412 of electrically conductive vias 414 that pass from a frontside 416 of the sub-mount wafer 410 to a backside 418 of the sub-mount wafer 410, and solderable contact pads 446. In fabricating the LED package of FIG. 6, during the sub-mount wafer level processing 206 individual LED underfill material 460 is applied to the flip chip bonding interface of each LED die 424 to hermetically seal critical components of the LED dice 424 such as the semiconductor layers 434 and electrodes 440. Preferably, the underfill material 460 is thermally conductive to contribute to heat sinking. The underfill material 460 is suitably applied using a step-and-repeat apparatus that sequentially processes each flip-chip bonded LED die 424.

Figure 7:
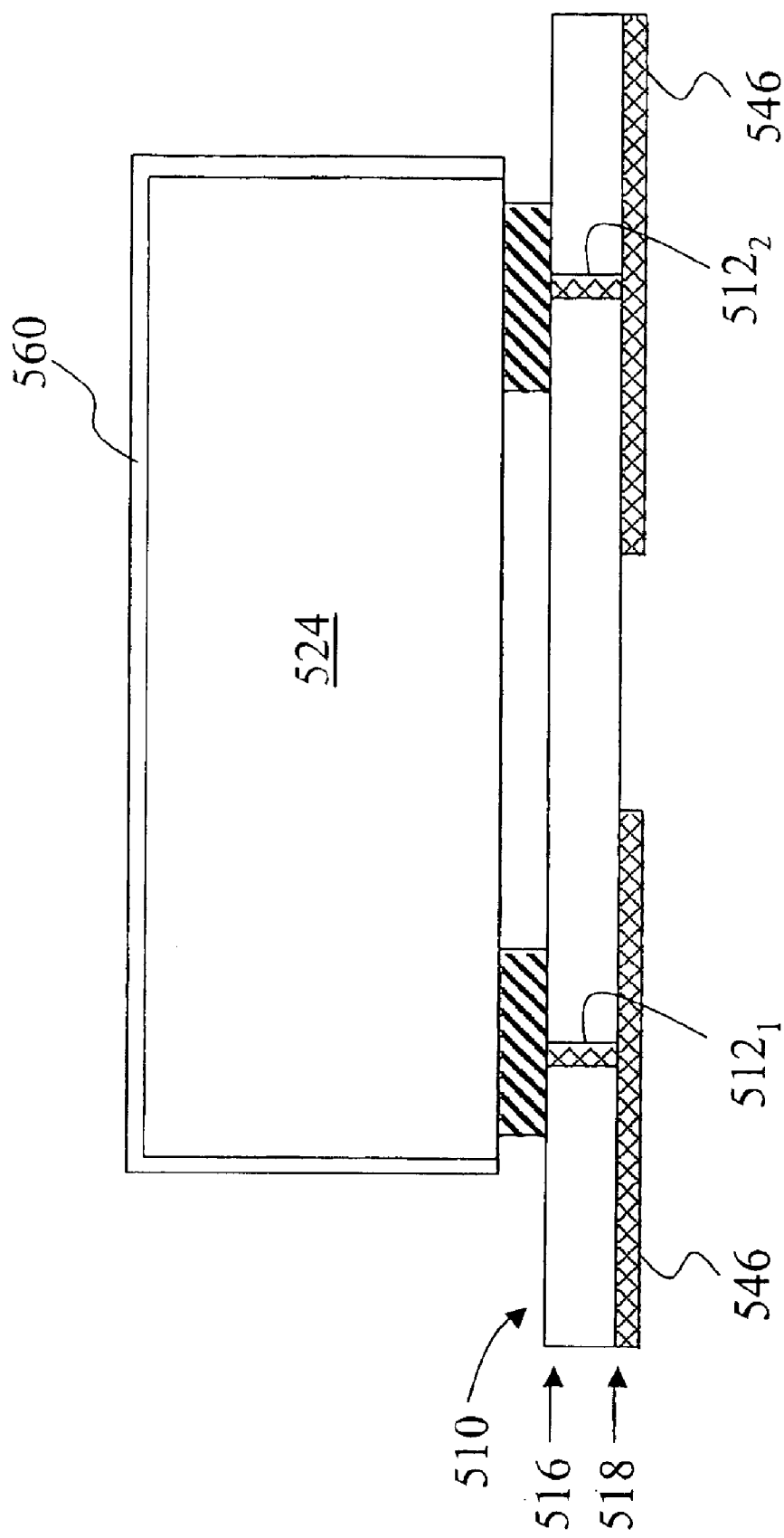
FIG. 7 shows a side sectional view of an LED die flip-chip bonded to an array of vias, with an optical coating applied to the LED die in a wafer-level process applied to the sub-mount wafer with the LEDs flip-chip bonded thereto.

With continuing reference to FIG. 4 and with further reference to FIG. 7, an LED package including an optical film 560 applied by sub-mount wafer level processing 206 is described. In the LED package of FIG. 7, components that correspond to substantially similar components of the LED package of FIGS. 1A–1E are indicated with reference numbers offset by a factor of 500, e.g. an LED die 524 in FIG. 7 corresponds with the LED die 24 of FIGS. 1A–1E. A sub-mount 510 includes arrays $512_1$, $512_2$, of electrically conductive vias that pass from a frontside 516 of the sub-mount wafer 510 to a backside 518 of the sub-mount wafer 510, and solderable contact pads 546. In fabricating the LED package of FIG. 7, during the sub-mount wafer level processing 206 the optical coating 560 is applied to the light transmissive substrates of the LED dice 524. The coating 560 can be an anti-reflection coating, a refractive index matching coating, a phosphor layer, or the like. The optical coating 560 can be applied using a step-and-repeat apparatus that sequentially processes each LED dice flip chip bonded to the sub-mount wafer 510. Alternatively, the optical coating 560 can be applied to the frontside 516 of the sub-mount wafer including the LED dice 524. In this latter approach, the coating 560 also coats the sub-mount wafer 510, unless the coating chemistry is such that the coating does not adhere to the submount wafer 510.

Figure 8:
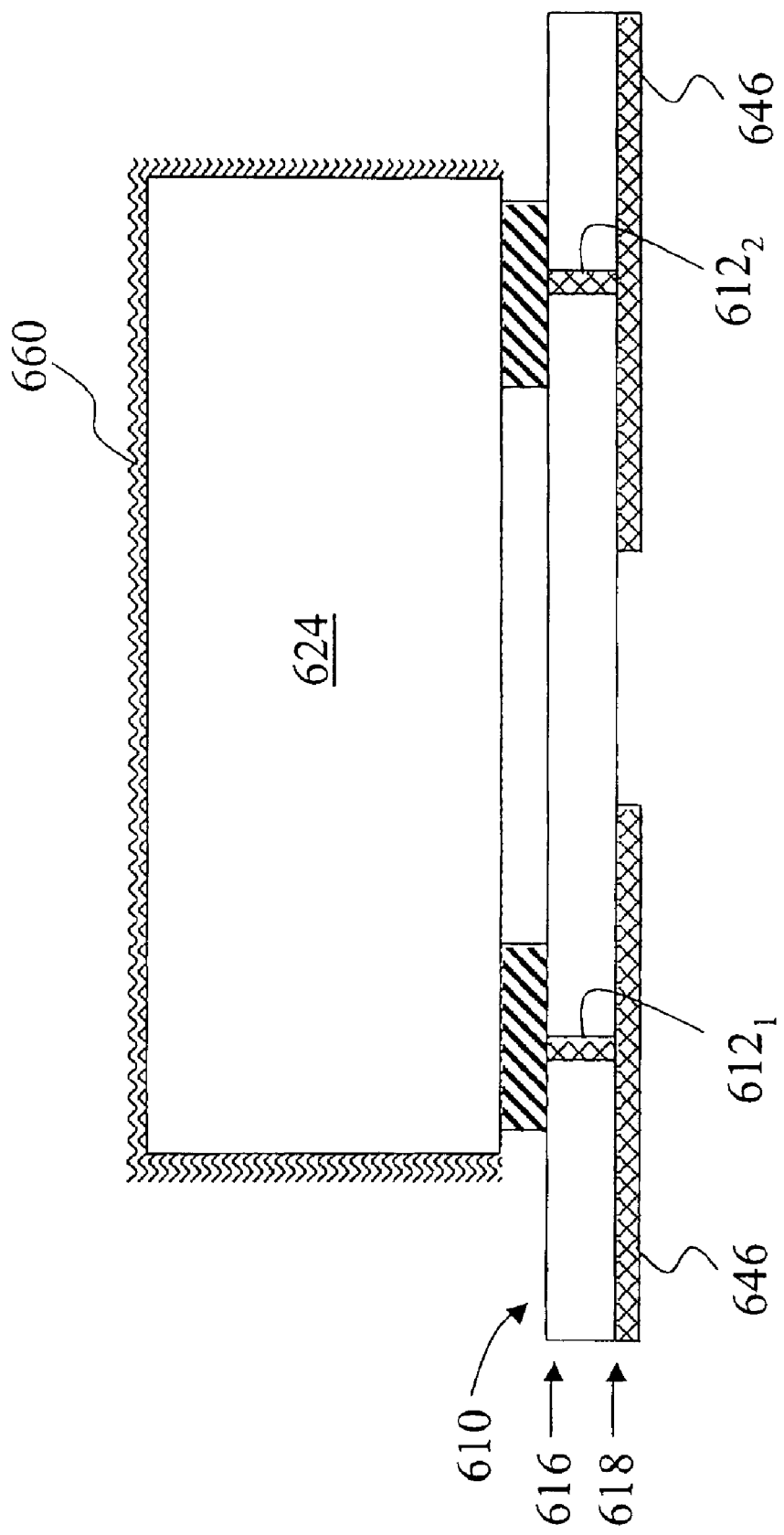
FIG. 8 shows a side sectional view of an LED die flip-chip bonded to an array of vias, with a contoured refractive surface etched on the LED die substrate using a wafer-level process applied to the sub-mount wafer with the LEDs flip-chip bonded thereto.

With continuing reference to FIG. 4 and with further reference to FIG. 8, an LED package includes a contoured refractive surface 660 providing a selected light refraction effect. The contoured refractive surface 660 is formed by the sub-mount wafer level processing 206. In the LED package of FIG. 8, components that correspond to substantially similar components of the LED package of FIGS. 1A–1E are indicated with reference numbers offset by a factor of 600, e.g. an LED die 624 in FIG. 8 corresponds with the LED die 24 of FIGS. 1A–1E. A sub-mount 610 includes arrays $612_1$, $612_2$, of electrically conductive vias that pass from a frontside 616 of the sub-mount wafer 610 to a backside 618 of the sub-mount wafer 610, and solderable contact pads 646. In fabricating the LED package of FIG. 8, during the sub-mount wafer level processing 206 a photolithographically or optically defined surface contouring pattern is formed in the transparent substrate of the LED die 624 by a suitable plasma etching, wet chemical etching, or the like. The contoured refractive surface 660 can include light-refractive prism features, a Fresnel lens pattern, or other selected light refraction contours.

Figure 9:
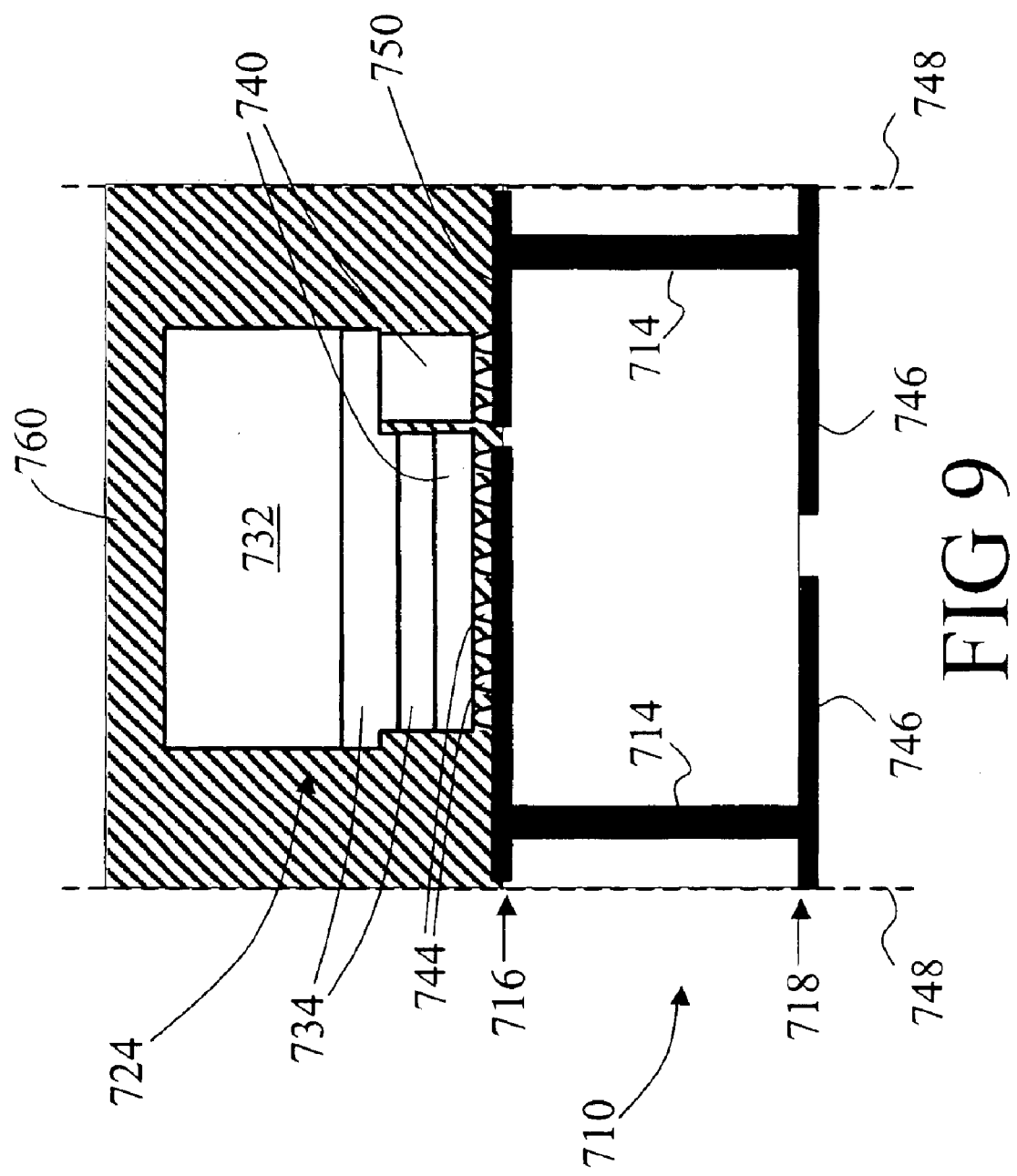
FIG. 9 shows a side sectional view of an LED die flip-chip bonded to an array of vias arranged outside the lateral area of the LED die, with a die-encapsulating epoxy applied in a wafer-level process prior to separation of the individual LED packages.

With reference to FIG. 9, an LED package including a laterally continuous encapsulant film applied by the submount wafer level processing 206, as well as vias arranged outside a lateral area of the LED die, is described. In the LED package of FIG. 9, components that correspond to substantially similar components of the LED package of FIGS. 1A–1E are indicated with reference numbers offset by a factor of 700, e.g. an LED die 724 in FIG. 9 corresponds with the LED die 24 of FIGS. 1A–1E. The LED die 724 includes a light-transmissive substrate 732 and p-type and n-type electrodes 740. In fabricating the LED package of FIG. 9, during the sub-mount wafer level processing 206 a laterally continuous epoxy film or other encapsulating film 760 is applied to the sub-mount wafer 710. The encapsulant film 710 encapsulates all LED dice 724 that are flip chip bonded to the sub-mount wafer 710 in a single film deposition process. When the sub-mount wafer is separated along separation planes 748 in the sub-mount separation process 208 of FIG. 4, the separating defines the side edges of the encapsulant 710 for each separated surface mount LED package.

With continuing reference to FIG. 9, the LED package there illustrated also includes electrical vias 714 arranged outside of a lateral area of the LED die 724. The bonding bumps 744 are arranged on the printed circuitry 750 formed in the circuitry printing process 90 of FIG. 2, and the printed circuitry 750 connects the bonding bumps 744 with the vias 714. The vias 714 in turn connect with contact pads 746 disposed on the backside 718 of the sub-mount wafer 710. Preferably, in such an arrangement the sub-mount 710 provides the primary heat sinking pathway for the LED die 724. A suitable thermally conductive sub-mount material is AlN. Arrangement of the vias 714 outside a lateral area of the LED die 724 advantageously provides a smooth surface for the flip chip bonding, which can be important for certain types of die attach processes.

Figure 10:
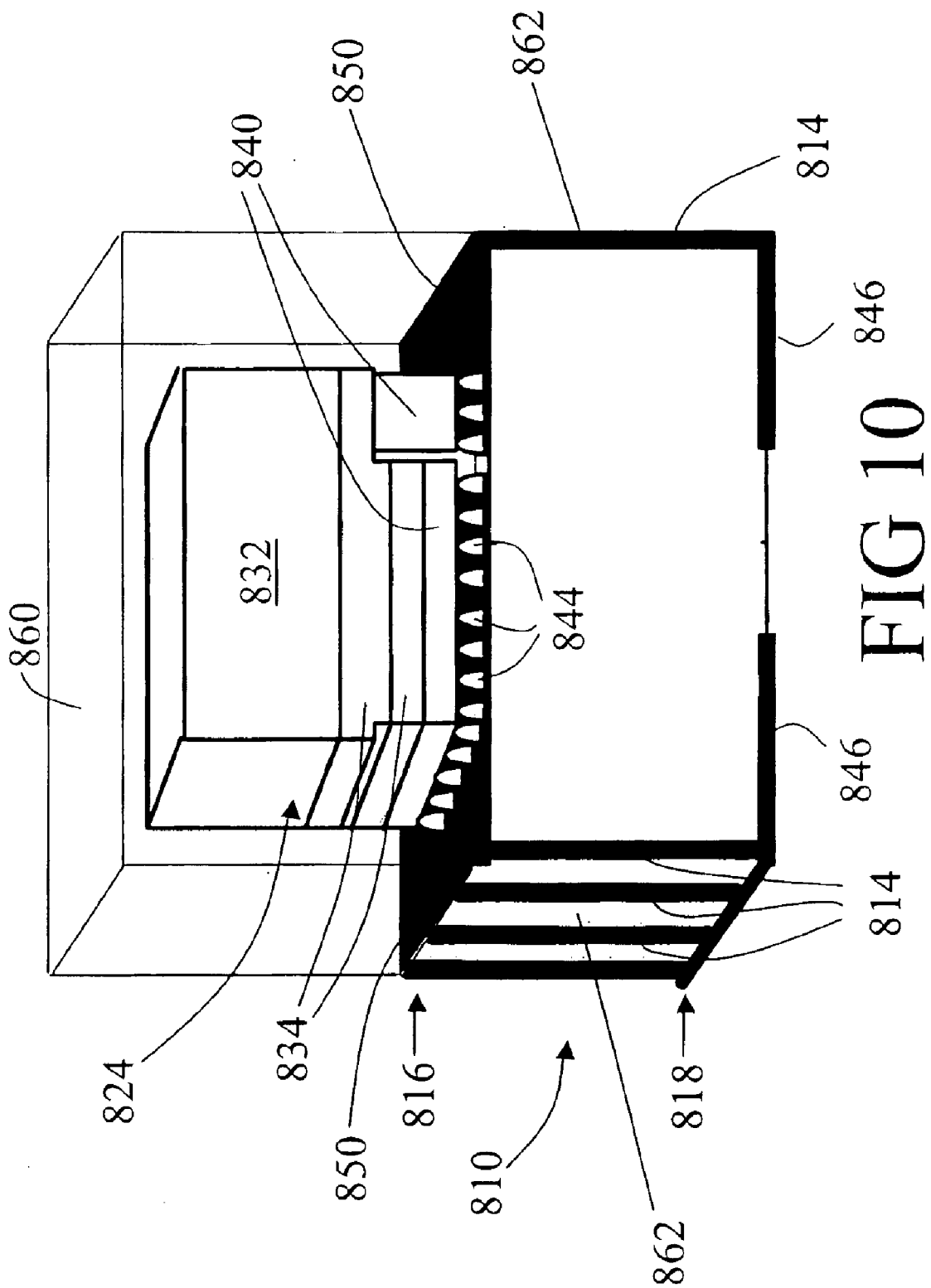
FIG. 10 shows a perspective view of an LED die flip-chip bonded to an array of vias arranged outside the lateral area of the LED die, in which the LED package is separated by cutting through the via array to produce conductive sidewalls. A die-encapsulating epoxy is applied in a wafer-level process prior to separation of the individual LED packages.

With reference to FIG. 10, an LED package including a laterally continuous encapsulant film and vias arranged as sidewalls of the separated LED package is described. In the LED package of FIG. 10, components that correspond to substantially similar components of the LED package of FIGS. 1A–1E are indicated with reference numbers offset by a factor of 800, e.g. an LED die 824 in FIG. 10 corresponds with the LED die 24 of FIGS. 1A–1E. A sub-mount 810 supports an LED die 824 that includes p-type and n-type semiconductor layers 834, p-type and n-type electrodes 840, and solderable contact pads 846. A wafer level encapsulant film 860 substantially similar to the encapsulant film 760 of FIG. 8 is applied as a laterally continuous film during the sub-mount wafer level processing 206.

Vias 814 are arranged outside a lateral area of the LED die 824, with printed circuitry 850 electrically connecting bonding bumps 844 with the vias 814. During the LED package separation process 208 of FIG. 4 the individual surface mount LED packages are separated along separation planes that substantially coincide with a central axis of the vias 814. Hence, the vias 814 are disposed on sidewalls 862 of the separated LED package. To facilitate separation, the via formation process 86 of FIG. 2 preferably is limited to deposition of the electrically conductive via material onto sidewalls of the drilled openings. Arrangement of the vias 814 on sidewalls of the separated LED package beneficially improves structural reliability of the separated surface mount LED package as compared with other embodiments which include vias that pass through the sub-mount in the separated surface mount LED package. Preferably, an AlN or other thermally conductive sub-mount material is employed to provide primary heat sinking.

The LED packages of FIGS. 9 and 10 include encapsulating films 760, 860 that are applied across the frontside 716, 816 of the sub-mount wafer 710, 810 during the sub-wafer level processing 206 of FIG. 4. The lateral edges or sidewalls of the encapsulant for each separated surface mount LED package is defined by the separation planes 748, which are transverse to the frontside surface 716, 816 in the LED packages of FIGS. 9 and 10.

Figure 11:
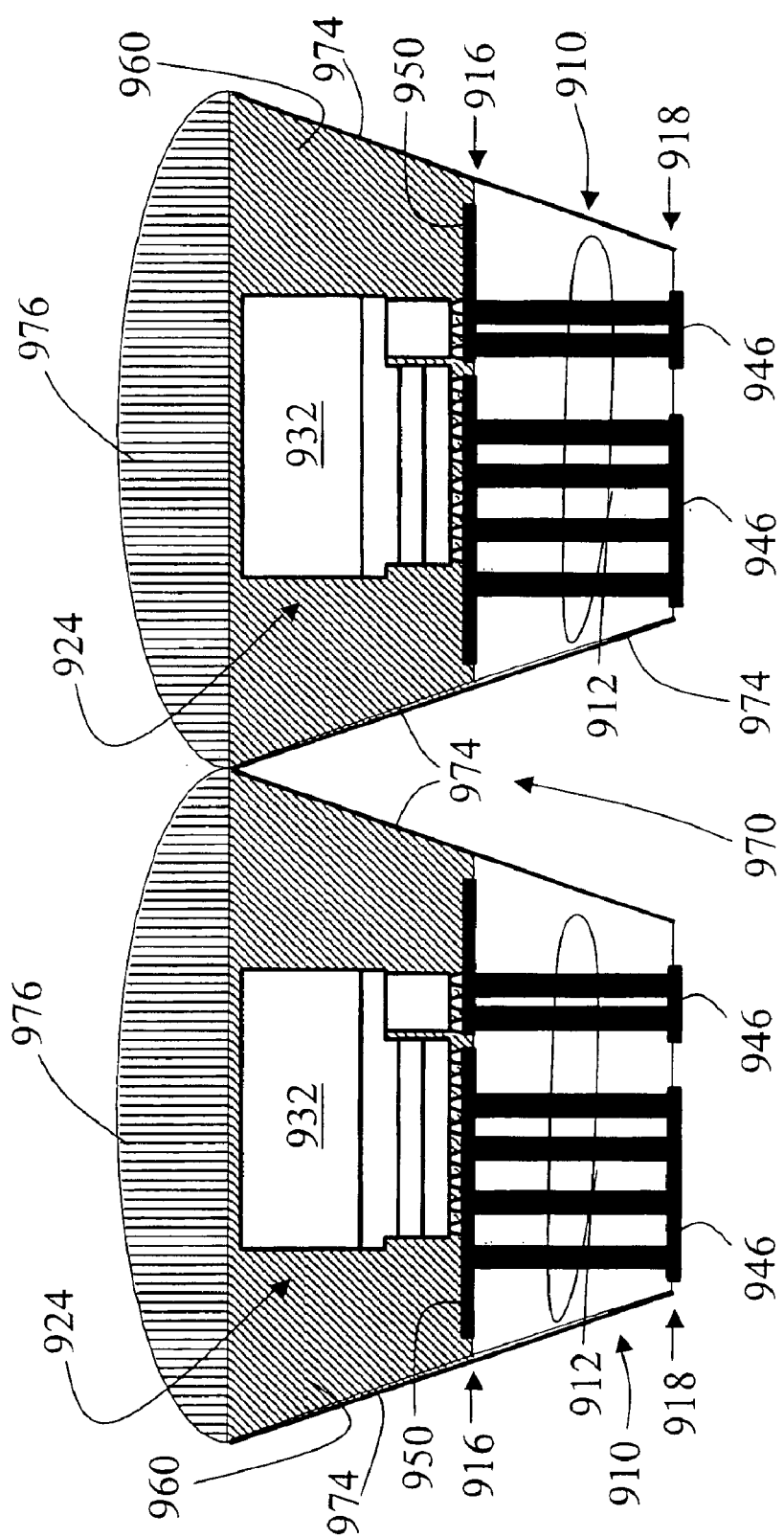
FIG. 11 shows a side sectional view of an LED die flip-chip bonded to an array of vias arranged outside the lateral area of the LED die. A die-encapsulating epoxy is applied in a wafer-level process, followed by a step-and-repeat bonding of transfer molded lenses, and the LED packages are separated along the "V"-shaped grooves.

With reference to FIG. 11, a surface mount LED package with non-vertical separation planes is described. In the LED package of FIG. 10, components that correspond to substantially similar components of the LED package of FIGS. 1A–1E are indicated with reference numbers offset by a factor of 900, e.g. an LED die 924 in FIG. 11 corresponds with the LED die 24 of FIGS. 1A–1E. The LED package shown in FIG. 11 includes the LED die 924 with transparent substrate 932 flip chip bonded to the sub-mount 910 which has via arrays 912 electrically connecting printed circuitry 950 on the sub-mount frontside 916 with solderable bonding pads 946 on the sub-mount backside 918. A planar encapsulant film 960 is applied similarly to the planar films 760, 860 of FIGS. 9 and 10.

However, rather than vertical separation planes 48 used in the LED package described with reference to FIGS. 1A–1E, the LED package of FIG. 11 is separated using a "V"-shaped groove 970 cut from the backside 918 of the sub-mount wafer. After formation of the "V"-shaped grooves 970 but before LED package separation, reflective material is deposited on the backside 918 to form reflective coatings 974 on angled sides of the encapulant 960 to define a reflector cup. The remaining sub-mount material is then fractured to separate the surface mount LED packages. Optionally, a transfer molded lens 976 is disposed on each surface mount LED package further improve light extraction.

Figure 12:
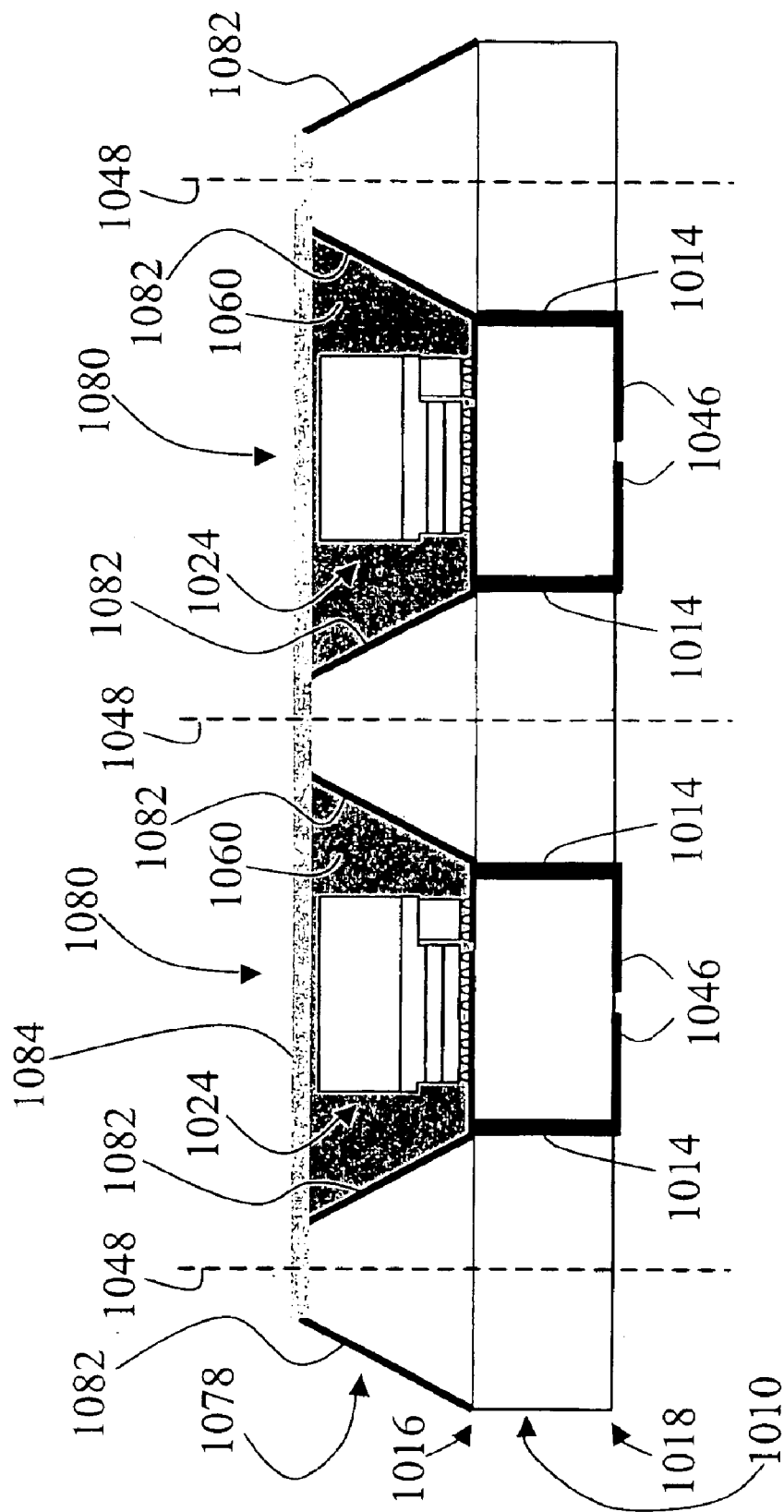
FIG. 12 shows a side sectional view of two LED dice flip-chip bonded to arrays of vias, with a cavity wafer bonded to the sub-mount wafer. The cavity wafer is arranged on the sub-mount wafer so that reflective cavities formed therein receive the LED dice, and each cavity is filled in step-and-repeat fashion with an encapsulant.
Figure 13:
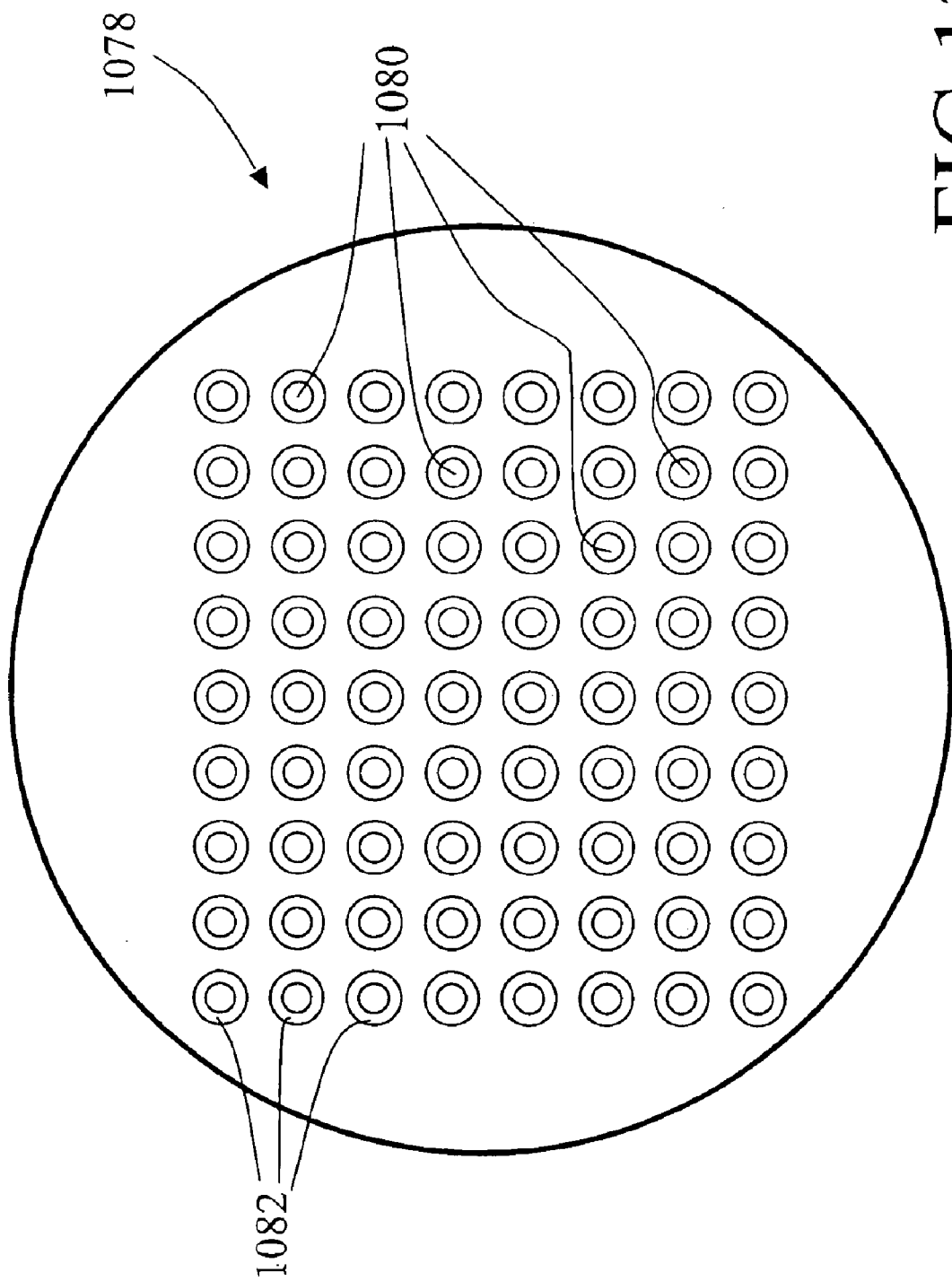
FIG. 13 shows an frontside view of the cavity wafer of FIG. 12 with cavities fabricated therein, prior to bonding onto the sub-mount wafer.

With reference to FIGS. 12 and 13, a surface mount LED package with reflector cavities defined by a cavity wafer is described. In the LED package of FIG. 12, components that correspond to substantially similar components of the LED package of FIGS. 1A–1E are indicated with reference numbers offset by a factor of 1000, e.g. an LED die 1024 in FIG. 12 corresponds with the LED die 24 of FIGS. 1A–1E. The LED package shown in FIG. 12 includes the LED die 1024 flip chip bonded to the sub-mount 1010 which has vias 1014 electrically connecting the LED die 1024 on the sub-mount frontside 1016 with solderable bonding pads 1046 on the sub-mount backside 1018.

Figure 14:
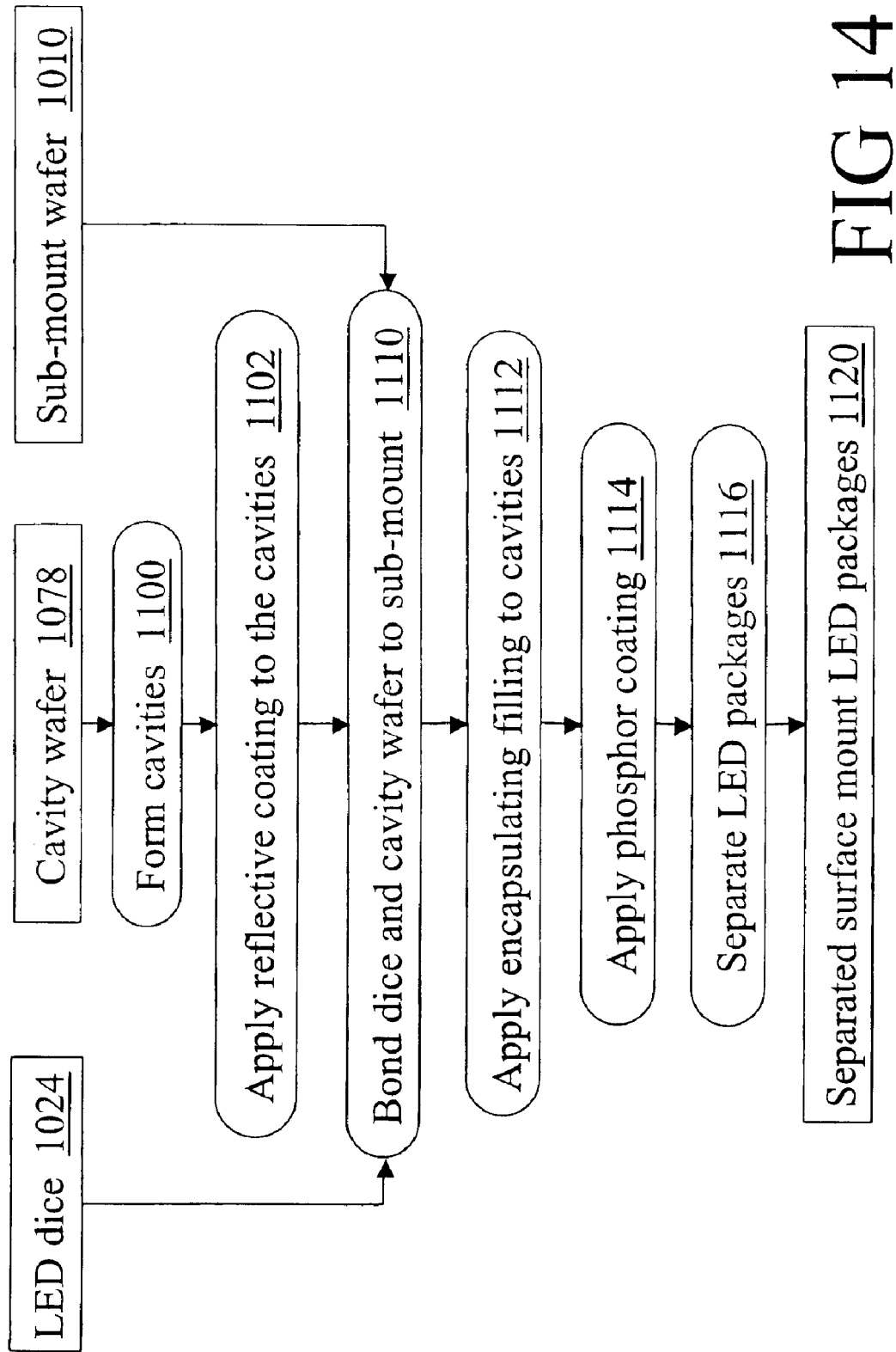
FIG. 14 shows a suitable method for fabricating the cavity wafer of FIGS. 12 and 13 and for combining the cavity wafer with LED dice and sub-mount wafer components fabricated in accordance with the processing of FIG. 2 to produce separated LED packages.

With continuing reference to FIGS. 12 and 13 and with further reference to FIG. 14, a cavity wafer 1078 (a frontside of which is shown in FIG. 13) that defines reflector cavities is bonded to the frontside 1016 of the sub-mount wafer 1010. The cavity wafer 1078 includes cavities 1080 each having a shape of a cut-off cone (that is, the cavities have a shape of a frustum of a cone). In one suitable embodiment, the cavity wafer 1078 is a silicon wafer and the slanted sides of the cavities 1080 are formed 1100 at a selected angle by drilling followed by anisotropic etching. A reflective material is applied 1102 to the frontside of the cavity wafer 1078 to form reflective layers 1082 on the slanted sides of the cavities 1080 that define the reflector cups. Instead of a reflective coating 1082, a white ceramic cavity wafer without an optical coating can be used.

The LED dice 1024 and the cavity wafer 1078 with reflective cavities 1080 formed therein are bonded 1110 to the sub-mount wafer 1010, with the flip chip bonded LED dice 1024 and the cavity wafer 1078 relatively positioned such that each reflector cavity 1080 receives one LED die 1024. In a suitable encapsulation process 1112, encapsulant material is dispensed on top of the bonded cavity wafer 1078 and urged into the cavities 1080 using a sponge, squeegee, or the like to form an encapsulating filling 1060. Alternatively, an automated step-and-repeat encapsulant applicator can be used. Optionally, a phosphor coating 1084 is applied 1114 to the surface of the cavity wafer 1078 and the encapsulating filling 1060 to convert LED light, such as blue or ultraviolet GaN LED light, into a selected illumination such as white light. Individual surface mount LED packages 1120 are separated 1116 by sawing or cutting the sub-mount wafer 1010 and bonded cavity wafer 1078 along vertical separation planes 1048.

The resulting LED packages 1120 are robust. Since the encapsulating filling 1060 is recessed in the cavities 1080, a soft material such as silicone can be used as the encapsulant material. The reflector cup formed by the cavities 1080 improves light extraction, and the sub-mount wafer level deposition of the phosphor layer 1084 provides consistent phosphor thickness and uniformity compared with phosphorizing individual LED dice, giving improved color consistency that is substantially independent of direction. Optionally, a lens array (not shown) is applied using an automated step-and-repeat applicator prior to the separating 1116 to further improve light extraction.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A method for producing a plurality of surface mount light emitting diode (LED) packages, the method including:

fabricating a plurality of light emitting diode (LED) dice each including light emitting semiconductor layers disposed on a light-transmissive substrate, and frontside p-type and n-type contacts disposed on the light emitting semiconductor layers opposite the light-transmissive substrate;

drilling a plurality of arrays of openings into an electrically insulating sub-mount wafer;

applying a metal to the drilled openings to produce a plurality of via arrays;

flip-chip bonding the LED dice onto a frontside of the electrically insulating sub-mount wafer, the p-type and n-type contacts of each flip-chip bonded LED electrically communicating with a solderable backside of the electrically insulating sub-mount wafer through a via array;

providing a thermal conduction path for thermally conducting heat from the flip-chip bonded LED dice to the solderable backside of the electrically insulating sub-mount wafer, and subsequent to the flip-chip bonding, separating the electrically insulating sub-mount wafer to produce surface mount LED packages each including at least one LED die.

2. The method as set forth in claim 1, wherein the providing of a thermal conduction path includes:

selecting an electrically insulating sub-mount wafer which is thermally conductive.

3. The method as set forth in claim 1, wherein the providing of a thermal conduction path includes:

drilling the plurality of arrays of openings with the openings of each array spatially distributed to provide substantially spatially uniform heat-sinking for the flip-chip bonded LED die.

4. The method as set forth in claim 1, wherein the providing of a thermal conduction path includes:

incorporating designated thermal conduction paths into each array of openings; and filling the designated thermal conduction paths with a thermally conductive material to produce thermally conductive vias that do not electrically contact the p-type and n-type contacts of the LED dice.

5. The method as set forth in claim 1, further including:

after the flip-chip bonding and before the separating of the electrically insulating sub-mount wafer, performing at least one wafer-level processing operation on the frontside of the electrically insulating sub-mount wafer with the flip-chip bonded LED dice attached.

6. The method as set forth in claim 1, further including:

after the flip-chip bonding and before the separating of the electrically insulating sub-mount wafer, encapsulating the frontside of the electrically insulating sub-mount wafer to hermetically seal the flip-chip bonded LED dice.

7. The method as set forth in claim 1, further including:

forming a plurality of optical cavities in a cavity wafer, each optical cavity corresponding to one of the via arrays; and before the separating of the electrically insulating sub-mount wafer, bonding the cavity wafer to the frontside of the electrically insulating sub-mount wafer such that the flip-chip bonded LED dice are disposed in the optical cavities.

8. A method for constructing a plurality of light emitting diode (LED) packages, the method including:

flip-chip bonding a plurality of LEDs to a frontside of an electrically insulating sub-mount wafer, the electrically insulating sub-mount wafer including front-side contacts that electrically contact electrodes of the LED during the flip-chip bonding, the electrically insulating sub-mount further including electrically conductive paths that electrically connect the front-side contacts with solderable contact pads arranged on a backside of the electrically insulating sub-mount wafer;

performing at least one wafer-level processing operation on the electrically insulating sub-mount wafer with the LEDs flip-chip bonded thereto; and separating the electrically insulating sub-mount wafer to produce the plurality of LED packages, each LED package containing at least one of the plurality of LEDs.

9. The method as set forth in claim 8, wherein the flip-chip bonding employs thermosonic bonding.

10. The method as set forth in claim 8, wherein the performing of at least one wafer-level processing operation on the electrically insulating sub-mount wafer with the LEDs flip-chip bonded thereto includes:

modifying a backside surface of light-transmissive substrates of the LEDs.

11. The method as set forth in claim 10, wherein the wafer-level processing includes at least one of:

chemically treating the electrically insulating sub-mount wafer to produce an etched pattern on the light-transmissive substrates of the LEDs, optically coating the electrically insulating sub-mount wafer including the light-transmissive substrates of the LEDs, applying a sealing material to the electrically insulating sub-mount wafer that encapsulates the flip-chip bonded LEDs, and step-and-repeat applying a molded material to the LEDs on the electrically insulating sub-mount wafer, the molded material defining an encapsulant locally applied to each LED.

12. The method as set forth in claim 8, further including:

bonding a cavity wafer to the frontside of the electrically insulating sub-mount wafer, the cavity wafer including optical cavities that receive the flip-chip bonded plurality of LEDs.

13. The method as set forth in claim 8, wherein the separating of the electrically insulating sub-mount wafer to produce the plurality of LED packages includes:

separating along at least some of the electrically conductive paths so that the separated LED packages include electrically conductive sidewalls.

* * * * *